(12) United States Patent
Schmitt-Weaver et al.

(10) Patent No.: US 12,032,297 B2
(45) Date of Patent: Jul. 9, 2024

(54) METHOD FOR MONITORING LITHOGRAPHIC APPARATUS

(71) Applicant: ASML NETHERLANDS B.V., Veldhoven (NL)

(72) Inventors: Emil Peter Schmitt-Weaver, Eindhoven (NL); Kaustuve Bhattacharyya, Veldhoven (NL); Martin Kers, Utrecht (NL)

(73) Assignee: ASML NETHERLANDS B.V., Veldhoven (NL)

( * ) Notice: Subject to any disclaimer, the term of this patent is extended or adjusted under 35 U.S.C. 154(b) by 430 days.

(21) Appl. No.: 17/291,513

(22) PCT Filed: Oct. 15, 2019

(86) PCT No.: PCT/EP2019/077844
§ 371 (c)(1),
(2) Date: May 5, 2021

(87) PCT Pub. No.: WO2020/099050
PCT Pub. Date: May 22, 2020

(65) Prior Publication Data
US 2022/0026809 A1    Jan. 27, 2022

(30) Foreign Application Priority Data

Nov. 16, 2018  (EP) ..................... 18206696
Jun. 24, 2019  (EP) ..................... 19181883

(51) Int. Cl.
G03F 7/20     (2006.01)
G03F 7/00     (2006.01)
G05B 13/04    (2006.01)

(52) U.S. Cl.
CPC ........... *G03F 7/705* (2013.01); *G05B 13/042* (2013.01)

(58) Field of Classification Search
CPC .... G03F 7/705; G03F 7/70516; G03F 9/7003; G03F 7/70633; G05B 13/042
See application file for complete search history.

(56) References Cited

U.S. PATENT DOCUMENTS 6,952,253 B2   10/2005  Lof et al.
7,265,364 B2    9/2007  Teunissen et al.
(Continued)

FOREIGN PATENT DOCUMENTS

EP   1628164    2/2006
EP   3382606   10/2018
(Continued)

OTHER PUBLICATIONS

International Search Report and Written Opinion issued in corresponding PCT Patent Application No. PCT/EP2019/077844, dated 2020.
(Continued)

*Primary Examiner* — Charles R Kasenge
(74) *Attorney, Agent, or Firm* — Pillsbury Winthrop Shaw Pittman, LLP

(57) ABSTRACT

A method of determining a parameter of a lithographic apparatus, wherein the method includes providing first height variation data of a first substrate, providing first performance data of a first substrate, and determining a model based on the first height variation data and the first performance data. The method further includes obtaining second height variation data of a second substrate, inputting the second height variation data to the model, and determining second performance data of the second substrate by running the model. Based on the second performance data, the method determines a parameter of the apparatus.

20 Claims, 9 Drawing Sheets

(56) References Cited

U.S. PATENT DOCUMENTS

| | | | |
|---|---|---|---|
| 7,646,471 | B2 | 1/2010 | Teunissen et al. |
| 2003/0229881 | A1* | 12/2003 | White ............... H01L 21/31053 |
| | | | 257/E21.244 |
| 2004/0247361 | A1 | 12/2004 | Zaal et al. |
| 2007/0157139 | A1* | 7/2007 | White ....................... G03F 1/70 |
| | | | 700/121 |
| 2007/0296960 | A1 | 12/2007 | Den Boef et al. |
| 2008/0198380 | A1 | 8/2008 | Straaijer et al. |
| 2008/0316442 | A1 | 12/2008 | Adel et al. |
| 2009/0168062 | A1 | 7/2009 | Straaijer |
| 2010/0007863 | A1 | 1/2010 | Jordanoska |
| 2010/0233600 | A1 | 9/2010 | Den Boef et al. |
| 2010/0328655 | A1 | 12/2010 | Den Boef |
| 2011/0026032 | A1 | 2/2011 | Den Boef et al. |
| 2011/0032500 | A1 | 2/2011 | Straaijer |
| 2011/0102753 | A1 | 5/2011 | Van De Kerkhof et al. |
| 2011/0102793 | A1 | 5/2011 | Straaijer |
| 2011/0188020 | A1 | 8/2011 | Den Boef |
| 2011/0249244 | A1 | 10/2011 | Leewis et al. |
| 2012/0044470 | A1 | 2/2012 | Smilde et al. |
| 2012/0044495 | A1 | 2/2012 | Straaijer |
| 2013/0162996 | A1 | 6/2013 | Straaijer et al. |
| 2013/0308142 | A1 | 11/2013 | Straaijer |
| 2016/0161863 | A1 | 6/2016 | Den Boef et al. |
| 2016/0370717 | A1 | 12/2016 | Den Boef et al. |

FOREIGN PATENT DOCUMENTS

| | | |
|---|---|---|
| TW | 200507047 | 2/2005 |
| WO | 2011012624 | 2/2011 |
| WO | 2016102127 | 6/2016 |
| WO | 2018072980 | 4/2018 |
| WO | 2018133999 | 7/2018 |
| WO | 2018153711 | 8/2018 |

OTHER PUBLICATIONS

Taiwanese Office Action issued in corresponding Taiwanese Patent Application No. 108140016, dated Jul. 30, 2020.

Taiwanese Office Action issued in corresponding Taiwanese Patent Application No. 108140016, dated Oct. 29, 2020.

Hwang, C. et al.: "Smart overlay metrology pairing adaptive deep learning with the physics-based models used by a lithographic apparatus", Proc. of SPIE, vol. 10587 (Mar. 20, 2018).

Cekli, H.E. et al.: "A novel patterning control strategy based on real-time fingerprint recognition and adaptive wafer level scanner optimization", Proc. of SPIE, vol. 10585 (Mar. 13, 2018).

Office Action issued in corresponding Chinese Patent Application No. 201980075526.7, dated Oct. 9, 2023.

C. Hwang et al., "Smart overlay metrology pairing adaptive deep learning with the physics-based models used by a lithographic apparatus", Proc. of SPIE, vol. 10587, pp. 1-8 (Aug. 20, 2018).

* cited by examiner

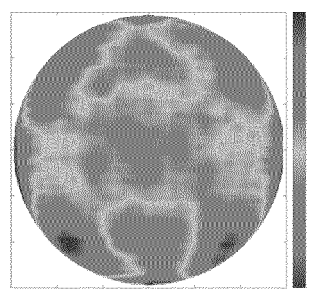
750
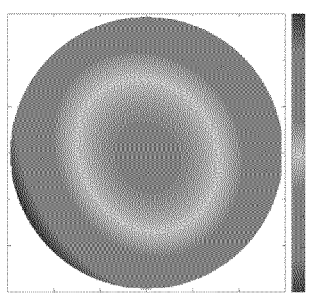
752
754
Fig. 8
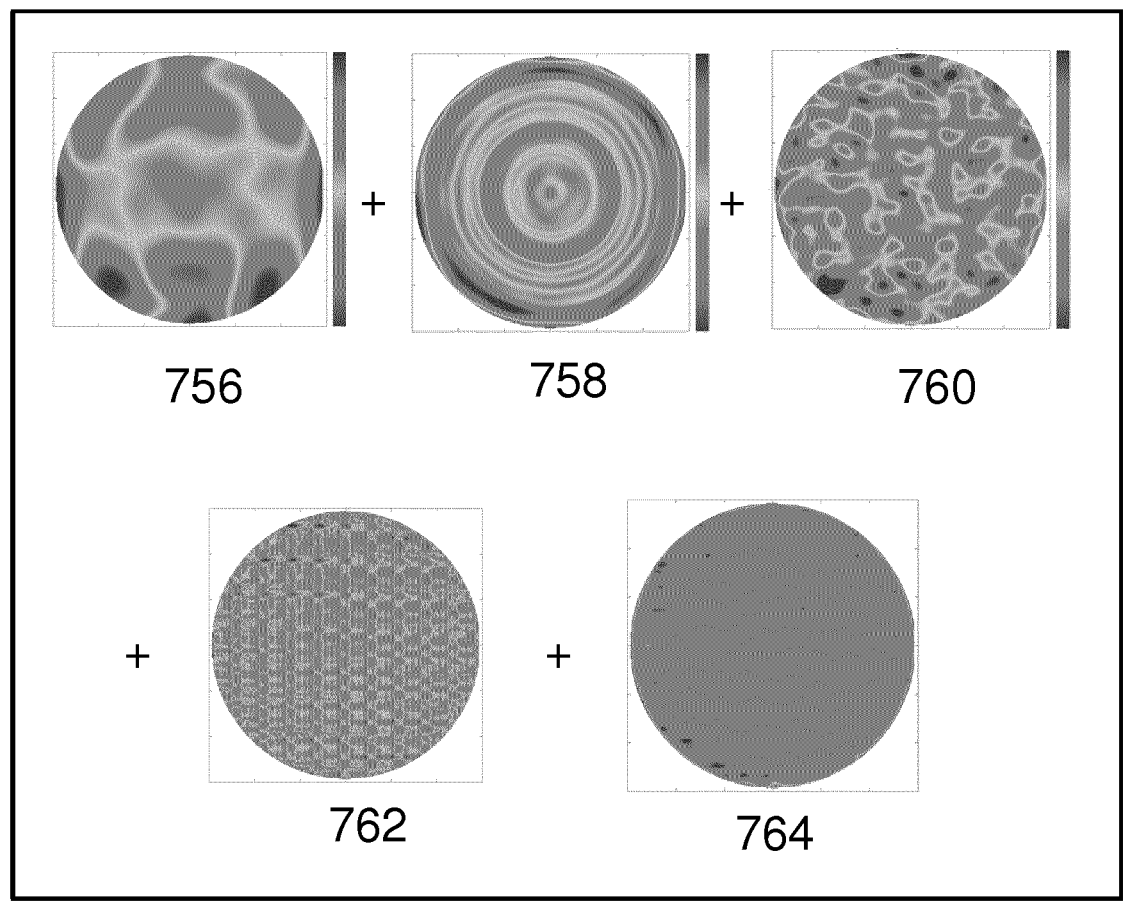
756  758  760
762  764

METHOD FOR MONITORING LITHOGRAPHIC APPARATUS

CROSS-REFERENCE TO RELATED APPLICATIONS

This application is the U.S. national phase entry of PCT Patent Application No. PCT/EP2019/077844 which was filed on Oct. 15, 2019, which is based upon and claims the benefit of priority of European Patent Application No. 18206696.9 which was filed on Nov. 16, 2018 and European Patent Application No. 19181883.0 which was filed on Jun. 24, 2019, each of which is incorporated herein in its entirety by reference.

TECHNICAL FIELD

The present invention relates to methods for monitoring lithographic apparatus. In particular, the methods relate to determining performance data of a substrate using a model and determining a parameter of the lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Metrology apparatus may be used to determine parameters of the lithographic system to monitor and control the patterning process by measuring data in relation to the lithographic process. Measurements may be performed in relation to the apparatus itself, or may be performed on substrates that are to be or that have been patterned in the lithographic apparatus. Different types of metrology tools may obtain different types of data, and that data may be used to determine different types of parameters. Different measurement tools have their own characteristics, for example regarding the speed and resolution by which data may be acquired. Therefore, some data may be more easily obtainable than other data. The present invention is concerned with the enhancement of monitoring and control of the lithographic process and apparatus, through improvement of the metrology process.

SUMMARY

According to an aspect of the invention there is provided a method of determining a parameter of a lithographic apparatus, the method comprising providing first height variation data of a first substrate, providing first performance data of the first substrate, and determining a model based on the first height variation data and the first performance data. The method may further comprise obtaining second height variation data of a second substrate, inputting the second height variation data to the model, and determining, by running the model, second performance data of the second substrate. The method may further comprise determining a parameter of the apparatus based on the second performance data.

Optionally, the first substrate and the second substrate are the same substrate.

Optionally, the method further comprises decomposing the first height variation data into at least a substrate specific fingerprint and wherein the determining of the model is based on the substrate specific fingerprint.

Optionally, the performance data is overlay data.

Optionally, the height variation data is levelling data.

Optionally, the method further comprises obtaining reference data of the second substrate, and inputting the reference data to the model.

The method according to claim 6, wherein obtaining the reference data comprises running the model a first time, the method further comprising: storing the second performance data as the reference data for inputting during a subsequent run of the model.

Optionally, the parameter is monitored to schedule maintenance action of the apparatus.

Optionally, the scheduled maintenance action relates to a substrate support or a reference substrate used to calibrate substrate positioning in the lithographic apparatus.

Optionally, the method further comprises providing first alignment data of the first substrate, determining the model based on the first alignment data, obtaining second alignment data of the second substrate, and inputting the second alignment data to the model.

Optionally, the method further comprises upsampling the resolution of the first or second alignment data, based on the respective first or second height variation data.

Optionally, the method further comprises decomposing the second height variation data into a plurality of subgroups, and inputting at least one of the plurality of subgroups to the model.

Optionally, one of the subgroups comprises data related to a field signature of the second substrate, and removing the field signature subgroup from at least one of the plurality of subgroups prior to inputting to the model.

Optionally, the method further comprises obtaining second performance data of the second substrate at a sparse resolution, inputting the sparse second performance data to the model, and estimating, using the model with input data, dense second performance data.

Optionally, the method further comprises obtaining the sparse second performance data from the second substrate using a metrology apparatus.

Optionally, the second substrate is a reference substrate.

Optionally, the second substrate is a calibration substrate.

Optionally, the parameter is a measure of the quality of a substrate support of the apparatus supporting the second substrate.

Optionally, the lithographic apparatus comprises the reference substrate.

Optionally, the parameter is related to one or more settings of the lithographic apparatus.

Optionally, the one or more settings of the lithographic apparatus is an exposure setting.

Optionally, determining the model comprises determining a matrix of weights and biases.

Optionally, determining the model comprises using a machine learning algorithm.

Optionally, the model comprises a neural network.

Optionally, the parameter relates to a metrology map.

Optionally, the method further comprises: updating one or more settings of the lithographic apparatus on the basis of the metrology map.

Optionally, the one or more settings relate to a positional grid of the lithographic apparatus.

Optionally, the parameter relates to a pre-exposure condition of the lithographic apparatus, the method further comprising: determining whether one or more settings of the lithographic apparatus requires correcting.

Optionally, the method further comprises estimating a level of required correction.

Optionally, the model comprises a first model and a second model, wherein the first and second models have different inputs and different outputs.

Optionally, the first model is run at a first periodicity to determine a first output relating to a first parameter, and the second model is run at a second periodicity to determine a second output relating to a second parameter, wherein the first periodicity is greater than the second periodicity.

Optionally, running the first model comprises receiving using a calibration substrate as the second substrate, and using the second model comprises using a reference substrate as the second substrate.

According to another aspect of the invention there is provided a method of improving an exposure by a lithographic apparatus, the method comprising loading a substrate into a machine onto a substrate support, determining height variation data of the substrate prior to an exposure, determining a parameter of the lithographic apparatus according to any of the methods of determining a parameter of a lithographic apparatus described above. The method may further comprise updating the lithographic apparatus based on the parameter, and exposing a pattern on the substrate by the lithographic apparatus.

According to another aspect of the invention there is provided a lithographic apparatus comprising a processor configured to determine a parameter in accordance with the methods described above.

According to another aspect of the invention there is provided a computer program comprising instructions which, when executed on at least one processor, cause the at least one processor to control an apparatus to carry out the method according to any of the methods described above.

According to another aspect of the invention there is provided a carrier containing the computer program as described in the above paragraph, wherein the carrier is one of an electronic signal, optical signal, radio signal, or non-transitory computer readable storage medium.

According to another aspect of the invention there is provided a recipe for controlling a lithographic apparatus comprising setpoints of a control parameter associated with the parameter as determined according to the method of any of the methods described above.

Optionally, the control parameter is associated with control of an overlay error.

Optionally, the setpoints are provided as coefficients of a high order model describing positioning errors across a substrate.

Optionally, the recipe is configured to periodically calibrate the lithographic apparatus.

Optionally, the calibration is configured to calibrate a coordinate system of a substrate positioning and/or substrate measuring system within the lithographic apparatus.

According to another aspect of the invention there is provided a method for calibrating a substrate. The method may comprise obtaining a model trained to correlate height variation data to performance parameter data. The method may further comprise obtaining a height variation data of the substrate, and decomposing the height variation data to determine a process signature of the substrate. The method may also comprise inputting data related to the process signature to the model, running the model to determine a predicted deviation of performance data between the substrate and a substrate standard, and calibrating the substrate using the predicted deviation of the performance parameter.

Optionally, the height variation data may be levelling data.

Optionally, the performance data may be overlay data.

Optionally, the data related to the process signature may comprise the process signature.

Optionally, the method may further comprise determining, for a plurality of substrates, an average process signature. The average process signature may be subtracted from the process signature to determine a substrate-to-substrate process signature. The data related to the process signature may comprise the substrate-to-substrate process signature.

Optionally, the process signature may relate to an etch of the substrate.

Optionally, the substrate may be a reference substrate.

BRIEF DESCRIPTION OF THE DRAWINGS

Embodiments of the invention will now be described, by way of example only, with reference to the accompanying schematic drawings, in which:

FIG. 8 depicts a schematic overview of a decomposition of height variation data into at least a process signature;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm). The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
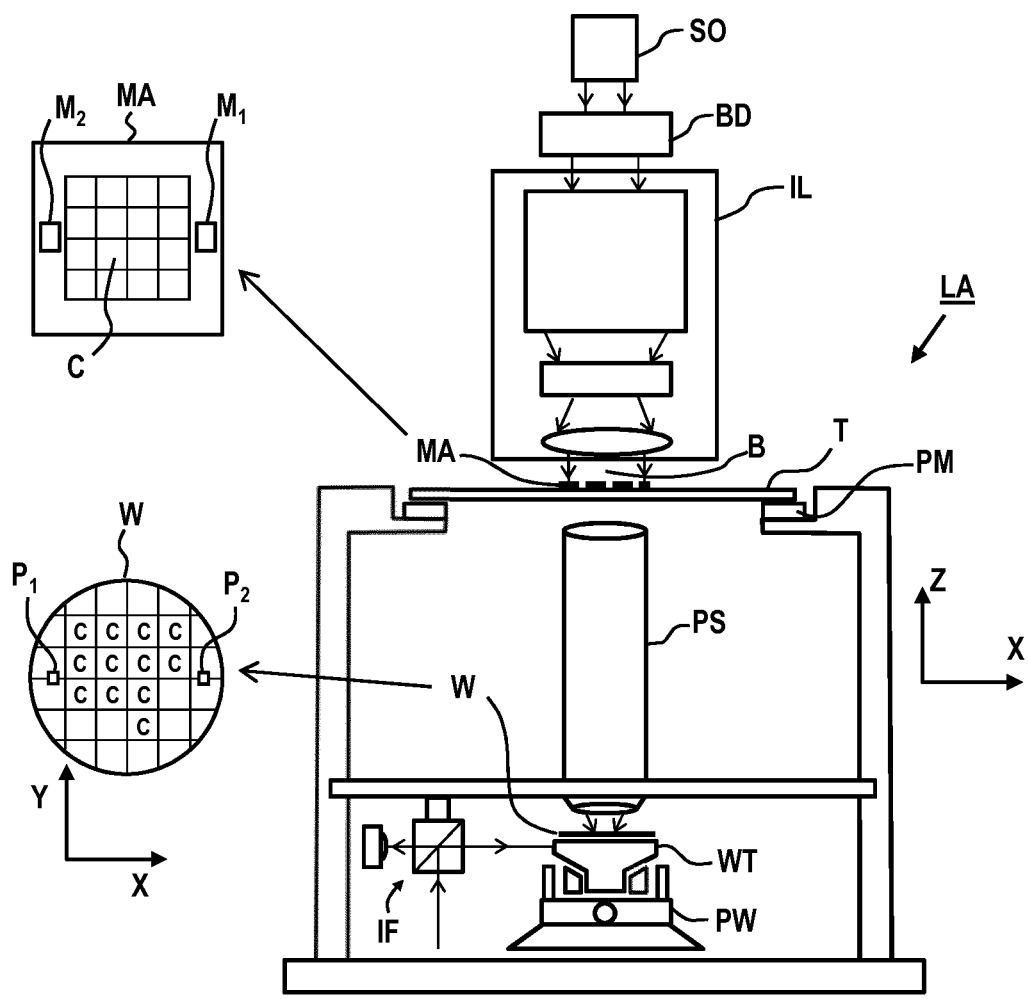
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
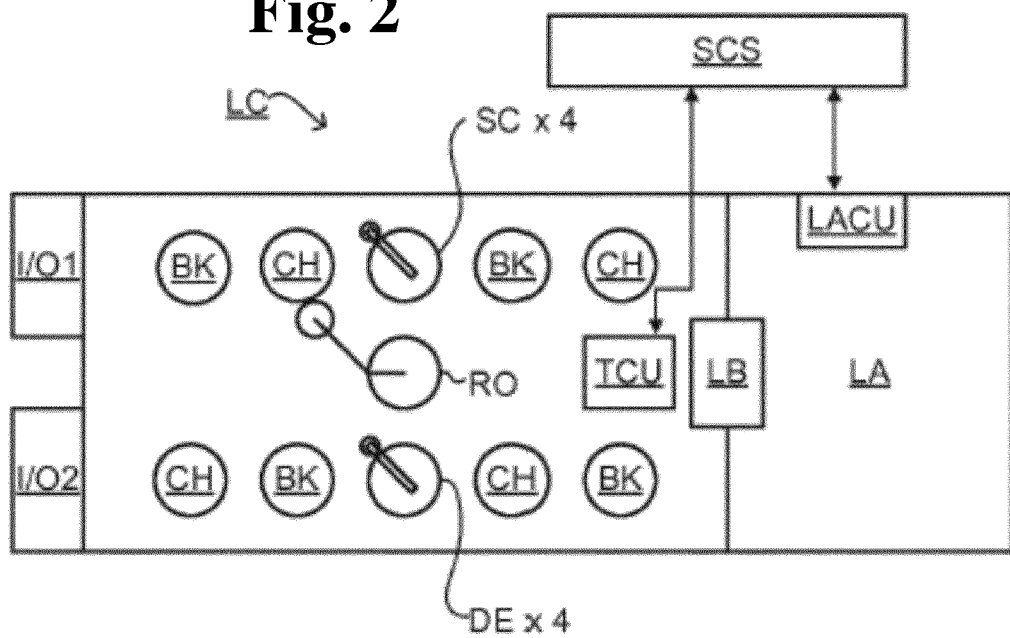
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
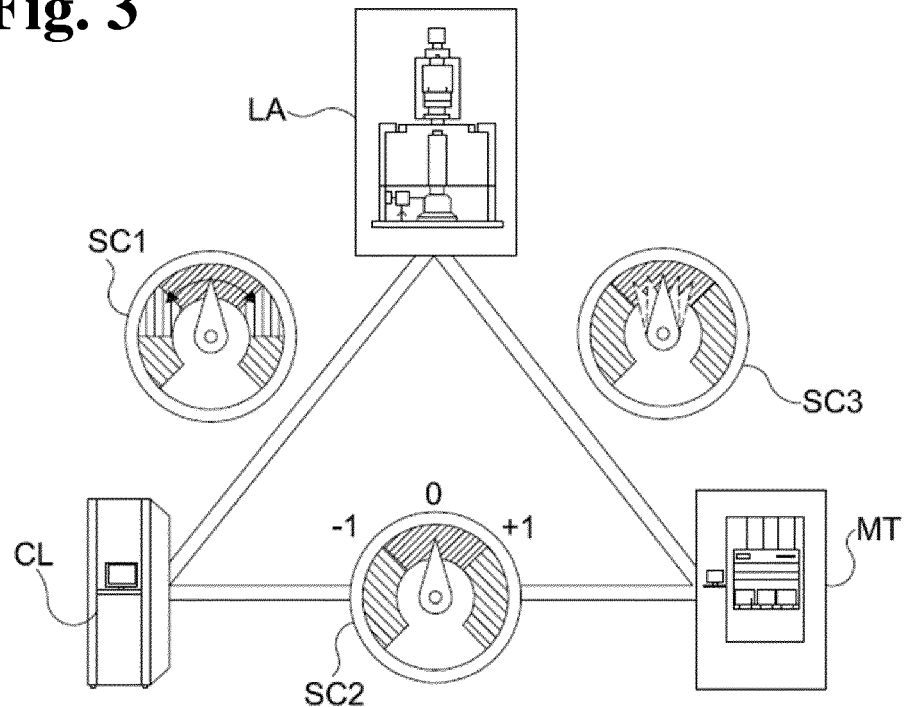
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1628164A, incorporated herein by reference in their entirety. Aforementioned scatterometers may measure gratings using light from soft x-ray and visible to near-IR wavelength range.

The scatterometer MT may be an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

The scatterometer MT may be a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

The scatterometer MT may be an ellipsometric scatterometer. The ellipsometric scatterometer allows for determining parameters of a lithographic process by measuring scattered radiation for each polarization states. Such a metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000, 229, 13/033,135, 13/533,110 and 13/891,410 incorporated herein by reference in their entirety.

The scatterometer MT may be adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1628164, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to as 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

A topography measurement system, level sensor or height sensor, which may be integrated in the lithographic apparatus, is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 4:
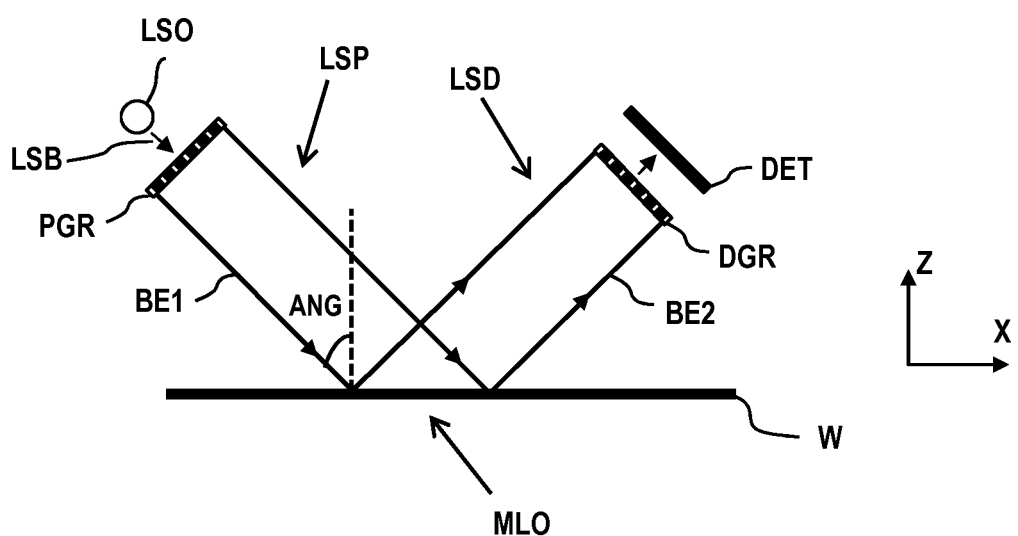
FIG. 4 depicts a schematic representation of a level sensor.

An example of a level or height sensor LS as known in the art is schematically shown in FIG. 4, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband radiation source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG. The projection unit LSP and/or the detection unit LSD may include further optical elements, such as lenses and/or mirrors, along the path of the patterned beam of radiation between the projection grating PGR and the detection grating DGR (not shown). In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of measurement beams BE1 onto the surface of the substrate W, thereby generating an array of measurement areas MLO or spots covering a larger measurement range. Various height sensors of a general type are disclosed for example in U.S. Pat. Nos. 7,265,364 and 7,646,471, both incorporated by reference. A height sensor using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating.

The various measurements described above typically occur after the substrate is clamped onto the substrate support and before exposure. In the clamped state, deviations can come from several sources such as error from substrate placement onto the substrate support; how the processing of the previous layer on the substrate has shaped the substrate surface; or if there is contamination on the backside of the substrate. Because the substrate is clamped onto the substrate support, any contamination between the substrate backside and the surface of the substrate holder or any non-uniform support characteristics may affect the substrates surface topography. Whilst in operation, the physical models that control the substrate-to-substrate adjustments of the lithographic apparatus use the alignment and levelling metrology to consistently position each substrate correctly in order to achieve accurate patterning of the substrate.

Defects such as damage to the substrate support during clamping may cause the substrate to be distorted. In particular, it will be understood that the substrate support will degrade over time due to friction between its support surface and the back side of the substrate and/or the effect of chemicals (used in treatment of the substrate during one or more processing steps). This support surface may typically comprise multiple protrusions or burls, largely to mitigate the effect of intervening contaminant particles between substrate and support. One or more of these burls, or other aspects of the substrate support (particularly at the edge), may be affected by such deterioration, resulting in changes in its shape over time which will influence the shape of a substrate clamped thereon. The effects of this deterioration of the substrate support may be uncorrectable using existing control systems. Methods described herein seek to provide an improved way of determining when a deterioration of a substrate support needs to be addressed.

The monitoring of the lithographic apparatus and processed substrates may be carried out at various stages. The lithographic apparatus may undergo one or more calibration process at installation, as part of introducing a new fabrication process, as part of a daily routine to detect short term changes, or more periodically, say once a week, to detect longer term drifts in the lithographic apparatus parameters. For example, it may be standard procedure to measure the levelling of a wafer table WT on a daily basis, and/or overlay alignment for a particular process once a week or on demand. Additionally, each substrate passing through the lithographic apparatus may be measured to determine the position of the substrate prior to exposure.

To enable an accurate picture to be established, successful monitoring typically requires large amounts of data to be gathered to provide sufficient cross-wafer information. Generally speaking, having more data tends to mean having a greater number of measurement points, i.e. a dense resolution of metrology, which may enable more detailed and/or precise monitoring but, inevitably, at a penalty of time. Sufficiently dense performance data, such as overlay data, may require several thousand measurements to be obtained from a reference substrate in order to provide the data with the correct resolution. This can take a significant amount of time to collect. It would therefore be desirable to decrease the amount of time needed for inspection of a substrate by the metrology tool, while still maintaining the ability to carry out detailed and precise monitoring of the lithographic apparatus LA performance.

It is also desirable to reduce the number or data acquisitions, i.e. measurements, by extending the interval between the measurement processes.

Disclosed herein are methods for determining a parameter of a lithographic apparatus LA using a model. The model may be used to effectively up-sample sparse metrology data to provide more useful dense metrology data. This metrology data can then be utilised to determine the parameter. The method of using a model in this way allows the data capture, i.e. measurement time, to be reduced whilst providing an acceptably dense data set.

In one example, the model may be provided by inputting a set of one or more sparse metrology data and training an algorithm to a corresponding output of dense metrology data. Once trained, the model may be used to up-sample sparse metrology data to provide an output of dense metrology data. The dense metrology data may then be used to assess one or more properties of the lithographic apparatus or determine when a calibration may be required.

The properties may relate to one or more parameters which may be adjustable to improve the performance of the lithographic apparatus. Additionally or alternatively, the properties may relate to one or more parameters indicative that some corrective maintenance, replacement of parts or recalibration of the lithographic apparatus or system may be required. Such parts may include a part or parts of the substrate support system. The recalibration may relate to the updating of a metrology map or coefficients of a high-order model which may be used to adjust the parameters of the lithographic apparatus.

In one example, metrology data may be obtained from a reference substrate (which may also be referred to as a reference wafer). The metrology data may include performance data such as overlay data, alignment and height map or levelling data. The metrology data may include sparse data and dense data. For example, the overlay data may include a sparse data set and a dense data set.

The model, which may be a neural network in one example, may include one or more layers defined by a number of weights and/or biases which map an input to an output. A selection of the metrology data, e.g. the levelling, alignment and sparse overlay data, may be used as an input for the model, with the known output being the measured dense overlay data. By running the model iteratively and adjusting the weights and biases to minimise the error, the weights and biases which map a particular input of sparse data to corresponding dense data may be obtained. Once the training is complete, the weights and biases are determined and the model can be used to up-sample sparse input metrology data taken in service to provide an output of corresponding dense overlay data. The dense metrology data may then be used to provide, for example, a metrology map for the wafer and/or lithographic apparatus which can be used in turn to adjust the apparatus.

Thus, an advantage of the disclosed method is that, using a suitably trained model, sparse metrology data can be used to provide corresponding dense metrology data which can be used in a number of different ways.

In another example, the model may be trained on a different set of one or more metrology data. For example, the input to the model may be levelling data only, which is trained to an output of metrology data, such as overlay data. The overlay data may be dense. Once trained, levelling data taken for example prior to a processing step or as part of a general monitoring or calibration process, may be used as an input to the model to provide dense overlay data from only the levelling data. Training the model using only one type of metrology data may result in a less accurate model. Hence, using only levelling data may result in an approximation of the overlay data. However, this approximation can save a significant amount of time and resources and be sufficient for determining useful metrics about the lithographic apparatus. Such metrics may relate to the wafer table WT or the accuracy of calibration and when a recalibration may be required.

Also disclosed herein is a recipe for controlling a lithographic apparatus. The recipe may comprise a plurality of set-points for a control parameter associated with the parameter as determined by the described method. The control parameter may be associated with the control of an overlay error for example. The set-points may be provided as coefficients of a high order model describing positioning errors across a substrate. The recipe may be configured to periodically calibrate the lithographic apparatus. The calibration may be in accordance with the newly derived setpoints based on the output of the model. The high order model may include a metrology map. The calibration may be configured to calibrate a coordinate system of a substrate positioning and/or substrate measuring system within the lithographic apparatus.

Figure 5:
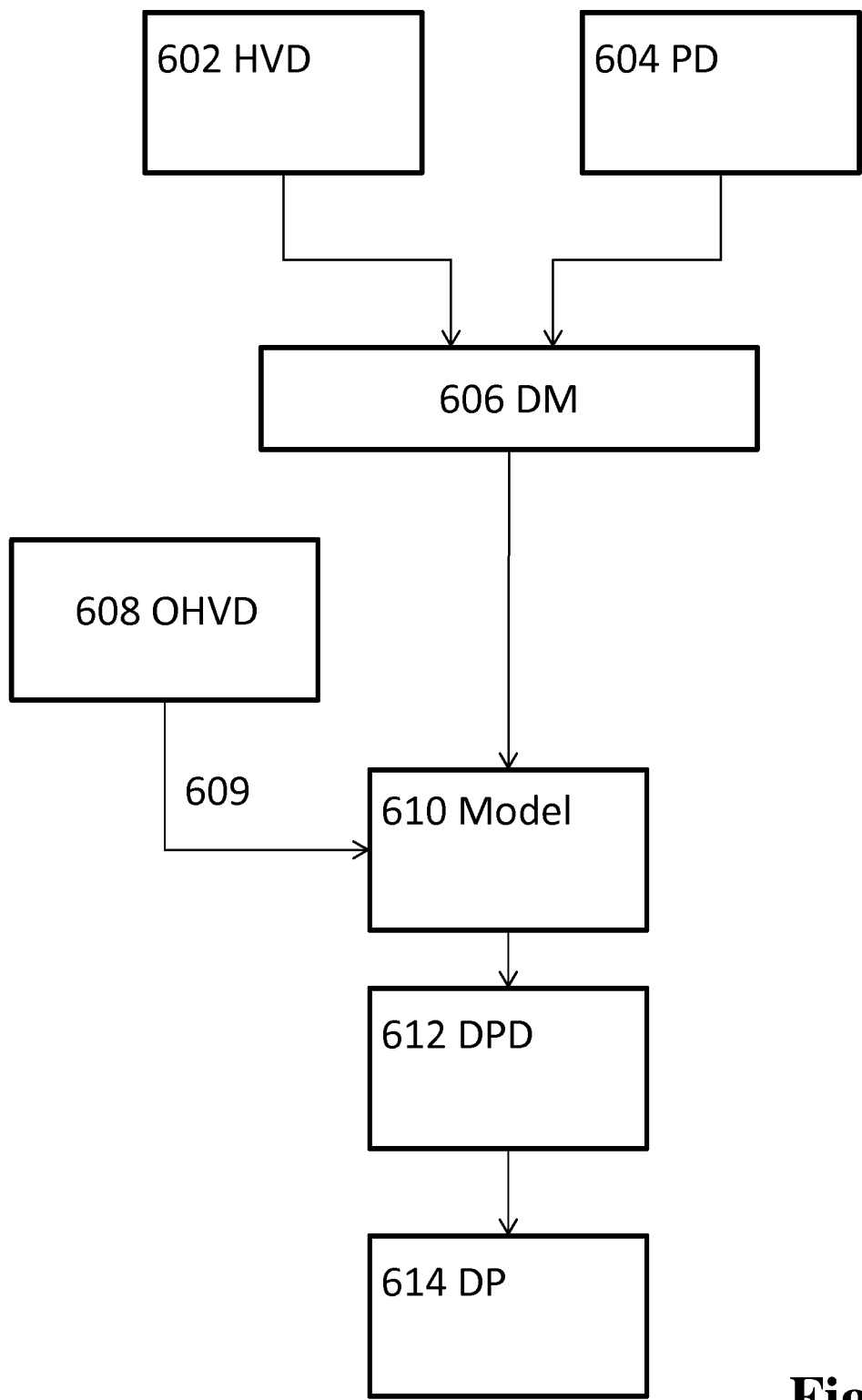
FIG. 5 depicts a schematic flow diagram of a method for determining a parameter of a lithographic apparatus.

More generally, FIG. 5 depicts a flow diagram of steps in a method for determining a parameter of a lithographic apparatus. In a first step 602, a first set of metrology data is provided. The metrology data may be first height variation data HVD of a first substrate. At a second step 604, a second set of metrology data may be provided. The second set of metrology data may be first performance data PD which relates to the first substrate. The first performance data PD may be overlay data or alignment data for example, or any other suitable data relating to one or more process related parameters of a reference substrate or processing apparatus. In a third step 606, a model is determined DM based on the provided metrology data, e.g. the first height variation data HVD and first performance data PD. Once the training is complete and the model 610 has been determined, the method may further comprise obtaining 608 second height variation data OHVD of a second substrate. The obtained second height variation data OHVD may be provided at step 609 as input to the model. Using the provided input data, the model may be run and determine 612, as an output of the model, second performance data DPD of the second substrate. The method may further comprise determining 614 a parameter DP of the lithographic apparatus LA based on the second performance data.

As mentioned above, performance data measurements may be time consuming to obtain. In one example, the performance data may be overlay data for patterns on a substrate. The model may be used to determine overlay data on the substrate at a dense resolution whilst using metrology apparatus to perform overlay measurements on the substrate in a sparse distribution. The model enables dense overlay data to be determined while only sparse overlay data was determined using metrology, thereby reducing the amount of time used by the metrology process for obtaining inspection data for the substrate. In another example, overlay data may be determined for a substrate at a dense resolution using metrology data other than overlay data as an input. The overlay data determined by the model may be used to determine a parameter and/or monitor performance of the lithographic apparatus LA, removing the need for obtaining overlay metrology.

Based on overlay data determined for a substrate, one or more parameters, recipes, or processes of the lithographic apparatus LA may be adjusted to achieve better overlay performance in subsequent exposures by the lithographic apparatus LA. Alternatively or additionally, the overlay data may be used to determine that the lithographic apparatus LA is not performing as expected or required. Performance data such as overlay data may therefore be used as a tool of for example error detection or predictive maintenance scheduling.

An advantage of the method is that a parameter of the lithographic apparatus LA can be determined based on the second performance data without requiring measurement of performance data of that substrate. Using height variation data in place of performance data will typically require less time. Height variation data may be obtained using a different measurement tool than the measurement tool used to obtain performance data, for example a level sensor or height sensor. Further, height variation is a parameter typically obtained on a frequent basis for other purposes. Hence, the described method may utilise existing data to determine performance data without requiring additional metrology.

The first height variation data and first performance data are related to a first substrate. The first substrate may be a substrate with known characteristics, and may be a reference substrate. The first height variation data may be provided in a first resolution, which may be a high resolution. The first performance data may be provided in a high resolution. The resolution of the height variation may be higher than the resolution of the performance data.

Sparse data and dense data are used in the relative sense in that dense data comprises more data points, e.g. points of measurement, then sparse data. The exact definition of dense and sparse will be dependent on the application and the metrology data in question. Any subset, e.g. downsampled, data set may be considered to be sparse as compared to the full data set which may be referred to as dense. Thus, the sparse data set may be considered to be a subset of a dense data set. The dense data set may include at least one entry for each of the metrology targets provided on a substrate.

Typically, dense data will have at least double the amount of data points compared with sparse data. So, for example, a 76 mm diameter wafer may have between one thousand and several thousand data points for dense metrology, and less than one thousand data points for sparse metrology data. Alternatively, dense measurement may correspond to a particular number of measurement points taken within a predetermined area. It will be appreciated that the wafer sizes may be considerably larger than 76 mm in diameter and may be as large as 450 mm or greater. Typical wafers will be between 200 mm and 300 mm.

The first and second substrate may be the same or same type of substrate. Thus, the second substrate may be the same type of substrate having the same features and having undergone substantially the same processing but nevertheless a different physical substrate. Alternatively, the second substrate may be the same first substrate, but at a later point in time. The second substrate may be the same as the first substrate, but at a different, later, step in a process applied to the substrate. The process may be a lithographic patterning process.

The substrate may be a reference wafer which is used to obtain metrology data as part of a monitoring or calibration process. The reference wafer may have one or more reference features on one or more layers. For example, the reference wafer may be designed and used to allow a metrology system to determine alignment data and overlay data. As such, the reference wafer may include one or more lines and spaces or grids as known in the art. Such a reference wafer may be referred to as a baseliner matched machine overlay substrate, as known in the art. Hence, the method may involve periodical exposure of features to a reference wafer which is provided with first features being positioned at known, calibrated, positions. By measuring the positions of the exposed features with respect to the first features the scanner grid which determines the exposure dose and focus across a wafer can be determined.

Alternatively, or additionally, the reference substrate may be used to provide calibration data relative to levelling data only. Such a reference substrate can be referred to as a levelling substrate, may require fewer layers and features then the first reference substrate used for overlay assessment.

The levelling substrate may be a blank wafer. The levelling substrate may be used to calibrate the levelling and/or other parameters of the substrate support. Such a substrate may be referred to as a conditioning wafer, or a chuck temperature wafer depending on the application.

The overlay reference substrate and levelling substrate may be used for different purposes and at different times. For example, the levelling substrate may be used, for example, on a daily basis as part of a daily calibration or monitoring process. Thus, the levelling substrate may be placed on the chuck and levelling data is gathered. The overlay reference substrate may be used less often than the levelling substrate as part of a monitoring process which determines whether any calibration of the lithographic apparatus is required after a predetermined time or number of fabrication runs. The overlay substrate may be used once a week for example, with the results being used to adjust a scanner or one or more other parameters of the lithographic apparatus. The reference substrates may be considered to form a part of the lithographic apparatus LA, as part of the monitoring and calibration process of the lithographic apparatus LA, for the purpose of this disclosure.

The reference substrates, the overlay substrate in particular, may require an update exposure from time to time so that the metrology map and lithographic apparatus calibration can be updated. In one example, the parameter of the lithographic apparatus which is determined by the method may relate to the one of the substrates. For example, the parameter may relate to the overlay substrate and provide an indication of when a new exposure is required and/or provide an estimate of error in the metrology map or reference wafer measurements.

Depending on the model which is used and the parameter which is being determined, the first substrate and second substrate may both be an overlay reference substrate. In other examples, the first substrate may be an overlay substrate for training the model, and the input may be provided from the second substrate in the form of the levelling substrate, as described below.

The model may be any model which can sufficiently map sparse input data to dense output data. The model may be, for example, a machine learning algorithm in which data is provided at the input and the algorithm is iteratively adjusted until output is within a predetermined error threshold. The model may be a neural network, or deep neural network.

The model may be determined, e.g. trained, based on the provided first height variation data HVD and first performance data PD taken from a plurality of substrates. The plurality of substrates may be sub-divided into training, validation and testing subsets. Thus, the model may be determined using height variation data HVD and performance data PD of at least two of the plurality of substrates. The model may be determined based on height variation data HVD and performance data PD from some but not all of the plurality of substrates. One or more first substrates may be reference substrates especially manufactured for the training of the model. Detailed and time-intensive metrology may have been performed on the training reference substrates in order to have detailed information on which the model can be trained and the results validated.

In one example, fourteen overlay reference substrates were provided. The plurality of fourteen substrates were divided into subgroups. A first subgroup included a plurality of training substrates used to train the model. A second group comprised a plurality of validation substrates used to validate the model. A third group of substrates were used to blind test the model. The third group of substrates were assessed using alternative methods to provide a known measure against which the output of the model could be assessed.

To train the model, the training subset of the plurality reference substrates were measured to determine the dense performance data PD and height variation data HVD. The height variation data HVD was inputted to the model to determine the correct weights and biases which mapped the height variation data HVD to the measured dense performance data.

To validate the model, second height variation data OHVD of the validation subgroup was obtained and provided to determine whether the error between the outputted dense performance data and measured performance data was within a predetermined tolerance. It will be appreciated, that the second resolution may be a sparse resolution resulting in a sparse height variation data set. At this point, the model is ready, subject to blind testing with the test subgroup.

Referring back to FIG. 5, in use, the second height variation data 608 may be input into the model 610, and the model 610 may be run to provide an output. Running a model 610 may comprise receiving, by the model 610, the input provided to the model 610, and determining, based on the model 610 and the input, an output. Determination of the output may involve one or more calculations and/or estimations by the model 610.

The output of the model 610 may comprise second performance data DPD of the second substrate. The second performance data DPD may be determined at a resolution at least as high as the resolution of the first performance data PD. The second performance data DPD may be provided at a resolution at least as high as the resolution of the second height variation data OHVD. In some examples, the output performance data DPD may be up-sampled to provide hyperdense performance data. Performance data may be considered hyperdense if it is provided at a resolution higher than the metrology measurements for the second substrate. The hyperdense data may provide performance data in a location where the second substrate has no metrology mark, e.g. an alignment mark. Hyperdense performance data may be determined using computational metrology techniques, more information on which is given in WO2018149553, which is incorporated herein by reference. The output performance data may be used to determine a process map which can be used to adjust the lithographic apparatus LA. An advantage of using hyperdense performance data to determine a process map, or to determine another fit to the data, is that the larger number of data points allow a higher order fit to be performed on the performance data, which may lead to a better and/or more detailed process map, or other fit.

The second performance data DPD may be used to determine, at step 614, a parameter DP of the lithographic apparatus LA. The second substrate may have been processed in the lithographic apparatus, so that the performance data comprises a component resulting from effects caused by the lithographic apparatus LA. The influence or effect of the lithographic apparatus LA may be comprised within the second height variation data OHVD obtained for the second substrate. The height variation data may have been obtained while the second substrate was located within the lithographic apparatus LA, for example if the height variation metrology tool obtaining the data is integrated with the lithographic apparatus LA. Alternatively or additionally, the effect of the lithographic apparatus LA on the second substrate may be so that the height variation OHVD on the second substrate has been changed as a result of the lithographic apparatus LA, for example through deformation of the substrate during positioning in the lithographic apparatus LA.

The height variation data HVD, OHVD may be provided by levelling data. The measurement tool used to measure levelling data may be a level sensor or height sensor, which may be integrated in the lithographic apparatus LA. The height variation data may be provided on the form of a height map, as described above.

A substrate W may be planar, that is to say, significantly larger in two dimensions compared to a third dimension of the substrate W. The smaller dimension may be referred to as the height of the substrate W. The other two dimensions may be form the plane of the substrate W. The planar substrate W may have a substantially similar height across the wafer plane. Variations in height may be introduced by lithographic and/or etching processes on the substrate. Variations in height across the substrate plane may be attributable to deformations of the substrate W, for example, caused by defects in the substrate material. Variations in height of the substrate W may further be caused by effects of the lithographic apparatus LA working on the substrate W, for example the substrate W may be deformed by a substrate support holding and/or clamping a substrate W in place on the stage to position it on the stage.

The measurement tool for determining height variation data HVD and the measurement tool for determining performance data PD may both be integrated with the lithographic apparatus LA. When processing a substrate in a lithographic apparatus LA, for example for patterning the substrate, the substrate W may be positioned on a substrate support WT. The substrate may be removably attached to the substrate support WT, for example by mechanical clamping, vacuum positioning, etc. The substrate W may remain positioned on the same substrate support throughout one or more of a lithographic patterning steps, height variation HVD data measurement, performance data PD measurements, and other processing steps performed on the substrate W.

The height variation data OHVD, HVD may be decomposed (also referred to as deconvolved) into constituent parts representative of different effects. At least one of these effects may be a substrate specific fingerprint. Determination of the model may be based on the substrate specific fingerprint of the height variation data HVD. Decomposition of the height variation data HVD for a substrate W may be performed for a position of the substrate W on a substrate support WT of the measurement tool MT on which the height variation data was obtained. The decomposition may comprise a deconvolution of the height variation data into a plurality of subgroups, wherein one or more of the subgroups may form a substrate specific fingerprint. The height variation data HVD may be deconvolved into four subgroups, representing the clamped shape of the substrate, the radial shape of the substrate, the high frequency signature of the substrate, and the field signature of the substrate. The clamped shape may be caused by the placement of the substrate W on the substrate support WT, and may specifically be caused by the mechanism(s) temporarily and removably attaching the substrate W on the substrate support WT.

The clamped shape deconvolved data in the clamped subgroup may be obtained by fitting a regularized least squares model to the height variation data HVD. The determination of the radial subgroup data may involve using design specifications of the substrate support WT on which the substrate W was located while the height variation data HVD was obtained. The radial subgroup and clamped subgroup may be removed, e.g. subtracted, from the height variation data, and a series of low pass filters may be used to separate the remaining height variation signal into a high frequency signature and a field level signature. High frequency data may comprise structures patterned on the substrate. The field level signature data may comprise patterned features, which may be features patterned by the lithographic apparatus LA. The field level signature may comprise features specific to the substrate itself, for example defects in the material of the substrate W.

As mentioned above, the performance data PD may be overlay data. Specifically, overlay data may have been obtained through one or more measurements by a metrology tool comprising one or more sensors. The metrology tool MT may be a scatterometer. The metrology tool MT may be integrated in the lithographic apparatus LA. The metrology tool MT may measure overlay data on a point-by-point basis, that is to say, overlay may be measured for one measurement location at a time. The amount of time needed by the metrology tool MT to perform overlay measurements may be linearly proportional to the amount of points measured by the metrology tool MT. The metrology tool MT may provide overlay data at a low resolution, by obtaining a sparse distribution of overlay measurement points across a substrate. The metrology tool MT may provide overlay data at a high resolution, by obtaining a dense distribution of overlay measurement points across a substrate. The amount of time needed to provide a low resolution overlay measurement is significantly shorter than the amount of time needed to provide a high resolution overlay measurement.

Further information on the training of neural network may be found in the paper by Hwang, Chan et al. "Smart overlay metrology pairing adaptive deep learning with the physics-based models used by a lithographic apparatus" Proc. SPIE 10587, Optical Microlithography XXXI, 105870B, 20 Mar. 2018, which describes a neural network model and height data deconvolution process which is suitable for carrying out the method described herein.

The method may further comprise obtaining reference data for the second substrate W, and inputting the reference data to the model. The model may use the provided reference data of the substrate W for which performance data is to be determined, alongside the obtained height variation data HVD of for the first or second substrate W. The reference data may comprise one or more of height variation data HVD and performance data PD. The reference data may comprise measured height variation data HVD from a previous measurement of the substrate W and/or measured performance data PD from a previous measurement of a substrate W. The reference data may comprise performance data PD determined during a previous run of the model. For example, the model may be run to determine performance data PD for a substrate W. The performance data PD may be stored as reference data in a suitable memory. For a subsequent use of the model, the reference performance data PD may be recalled from memory and input to the model to provide a baseline of the last known performance data. Using the last known performance data in this way may reduce the time needed to execute the model and obtain corrected performance data PD using the latest height variation data.

The reference data may be referred to as historical data. Historical data may comprise measured or determined performance data and/or measured height variation data. The historical data may have been obtained for the same substrate as the second substrate but at an earlier point in time. The reference data may be used by the model 610 as a reference or basis for determining output performance data for the second substrate. In one example, the model 610 determines overlay data for a substrate periodically. The most recent overlay data determined for a substrate W may be used as reference data for the next run of the model 610. When determining the most recent overlay data, the model 610 can use the previously determined overlay data as an input for determining the new overlay data. In some instances, the model may use overlay data, or more generally performance data, from a plurality of previous runs of the model.

The reference data may be provide weights and biases which are used when the model is trained or retrained. Using the reference data in this way reduces the amount of time required to train the model using new parameters.

In use, the second performance data DPD output from the model 610 may be used to determine a parameter of the lithographic apparatus LA. The performance data DPD may be used to schedule maintenance of the lithographic apparatus LA. This may be done by monitoring the parameter determined from the performance data DPD. Monitoring the parameter may comprise periodically running the model with a new set of obtained input data, that is to say, obtained height variation data OHVD for the substrate W. This enables periodic determination of the parameter of the lithographic apparatus LA based on the performance data PD output by the model. Based on monitoring of the parameter value over time, the need for maintenance may be predicted, and maintenance schedule accordingly.

A need for maintenance may, for example, be established if the determined parameter passes a threshold value or falls outside a predetermined range; if an unexpected parameter value is determined; or if a sudden or unusual change to the parameter occurs. In one example, the performance data DPD may be overlay data and the height variation data OHVD may be levelling data. The model 610 may determine overlay data for the substrate based on periodically obtained levelling data. If the overlay data passes a threshold value or if unexpected overlay data values are determined, the overlay data may be used to recalibrate or adjust one or more parts of the lithographic apparatus. Hence, for example, one or more parameters of the scanner may be adjusted to alter the focus or dose on a particular region of the wafer W. In one example, the determined parameter may indicate that a metrology map or other model requires an update and may also provide an estimate of the required update or error in the existing metrology map or model.

In another example implementation, the parameter of the lithographic apparatus LA may relate to the quality of the substrate support WT used to support the substrate in the lithographic apparatus LA. The substrate support may be a wafer table WT. The substrate support may degrade over time through use of the substrate support WT, for example by placing and/or subsequent removing of substrates W on the support WT. The quality of the substrate support WT may affect the positioning of a substrate W on the support WT, and the performance parameter determined for that support WT. Therefore the methods disclosed herein may be used to determine a parameter representing the quality of the substrate support WT. Periodic running of the model allows the parameter to be monitored. Maintenance of the substrate support WT may comprise replacing the substrate support WT.

Using the height variation data OHVD as an input to a model to provide dense overlay data may result in a less accurate prediction of the overlay data. That is, the use of the overlay data only provides a more approximate estimation of the overlay data. Such an approximation may be adequate for the purposes of determining whether the chuck has degraded; whether one or more parameters may need to be updated; and, to provide an estimation of how much the parameter may need to be updated. For example, the estimated dense overlay provided by the height levelling data may indicate that a metrology map may be out of date and provide an estimation of by how much.

The approximated overlay data may be used in a comparison to known or reference target or wafer. In one example, a similarity indexing method may be used to determine a similarity to a known or reference target or wafer. The similarity indexing method may be a hierarchical clustering method. The output from the comparison may provide an indication as to whether an update is required and, in some instances, an approximation of the update required.

In some examples, a predetermined threshold may be set for determining when a divergence in the similarity has been reached. The predetermined threshold may relate to when a new calibration is required or when the system requires cleaning. The threshold may relate to a distance-based yield with respect to a similarity distance.

The methods disclosed herein may further comprise providing first alignment data for a first substrate, wherein the mode 610 is determined based on the first alignment data as well as the first height variation data HVD, and first performance data PD. Alignment data may be obtained by an alignment metrology tool. The alignment metrology tool may be integrated in the lithographic apparatus LA.

Alignment data of a substrate may be measured by a metrology at a low resolution compared to the resolution of height variation data obtained for the substrate. The sparse alignment data, obtained at a low resolution, may be up-sampled as part of the method to a higher resolution. Upsampling of alignment may be achieved, for example, by using a combination of triangulation-based interpolation and bicubic interpolation on the sparse alignment data available for the substrate. Automated regularization with a Bayesian framework may be implemented to minimise the possibility of overfitting the data. Upsampling of first alignment data means that the determination of model 610 is based on high resolution alignment data. Upsampling of second alignment data means that the model 610 receives high resolution alignment data as input.

As mentioned above, height variation data may be decomposed into a plurality of subgroups, which may comprise a clamped shape subgroup, a radial shape subgroup, a high frequency signature, and a field level signature. Second height variation data may be decomposed into a plurality of subgroups, wherein at least one of the subgroups is used as input to model 610 for determining second performance data.

One of the subgroups of height variation data may comprise data related to the field level signature of the second substrate. In the example decomposition listed above, data related to the field level signature may be contained within the field level signature. The field level signature may comprise features intrinsic to the substrate itself. Field level features may comprise unique marks, for example unique marks may be present on a base grating of the substrate due to etching errors that occurred during creation of the base grating on the substrate. As these features are specific to the individual substrate, it is beneficial to remove effects caused by the field level signature from the analysis, and separate effects on height variation data caused by other properties, including for example the effects caused by the lithographic apparatus. Removing the field level signature from the model 610 determination and model 610 input may remove the need of other correction processes to handle field signatures at a later stage of the method or other subsequent data analysis.

As described above, the method determines performance data for a second substrate using a model 610 and height variation data of the second substrate. In some implementations described herein, the method may further comprise obtaining second performance data of the second substrate. The second performance data may be obtained at a sparse resolution. The method further comprises inputting the second performance data into model 610. The model 610 may determine second performance data at a dense resolution, that is to say a resolution higher than the resolution of the sparse input second performance data. Second performance data may be obtained using a metrology tool MT, which may be a scatterometer.

Figure 6:
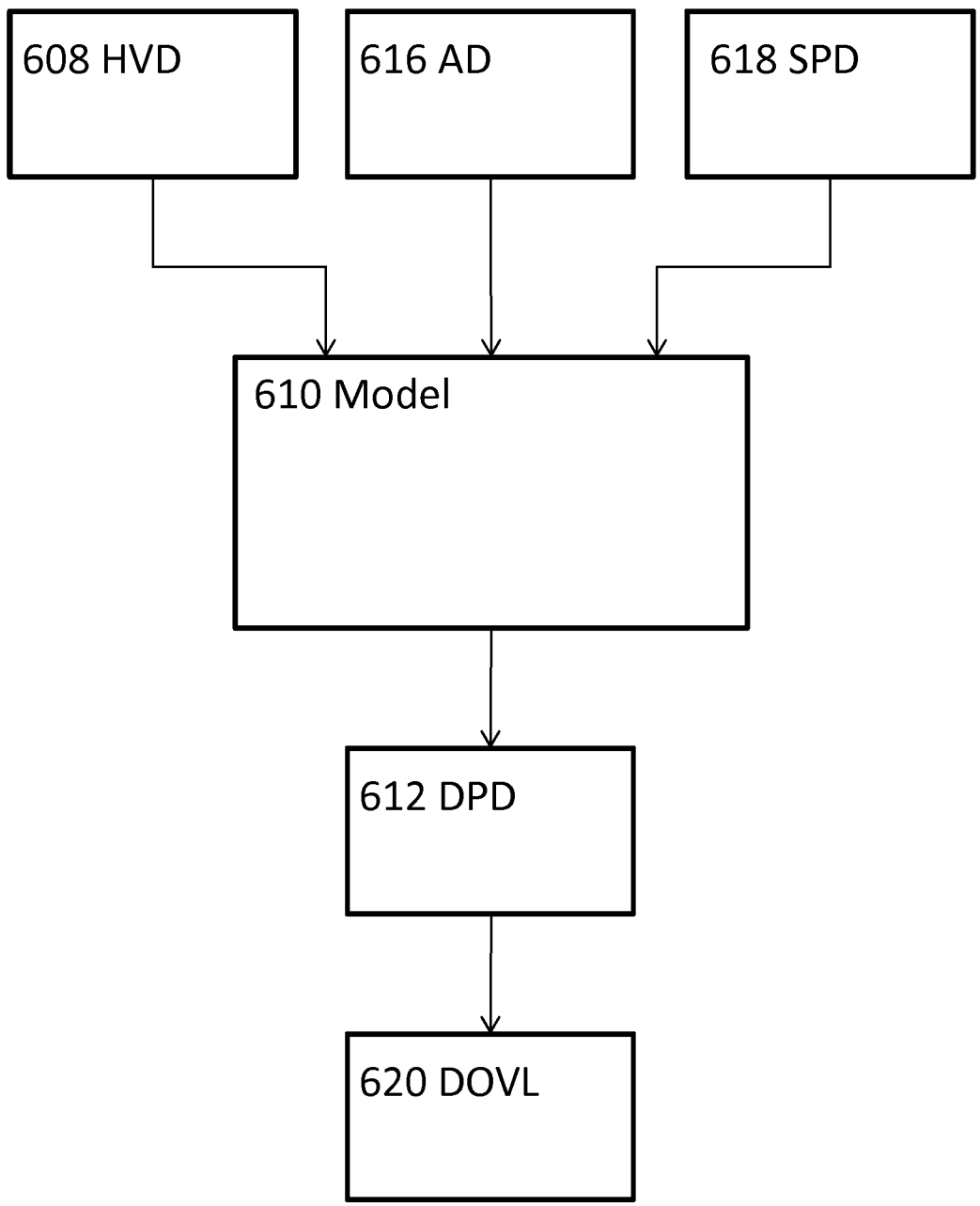
FIG. 6 depicts a schematic flow diagram of another method for determining a parameter of a lithographic apparatus.

FIG. 6 depicts a flow diagram of another example method for determining a parameter of a lithographic apparatus LA wherein a model 610 is determined in a similar way as described above, but with additional input data. Thus, in this second example, the method may further comprise training the model using three different types of input data including, for example, alignment data AD, height variation data HVD, and performance data PD. The inputs are mapped to measured sparse performance data DPD. In one example, the training of the model 610 may be achieved with inputs of sparse overlay data, sparse or dense alignment data and levelling data (which may have been deconvolved as described above). The output of the model 610 may be measured dense overlay data, as with the previously described model.

In use, once the model has been determined, the method may comprise obtaining 608 height variation data HVD of a second substrate, obtaining 616 alignment data AD, which may be upsampled from sparse alignment data, and obtaining 618 sparse performance data PD, wherein the data of steps 608, 616, and 618 are all obtained from the second substrate. The obtained data 608, 616, 618 is input into model 610, and the model is run to determine an output 612 of dense performance data DPD for the second substrate. Based on the determined performance data, a parameter DOVL of the lithographic apparatus may be determined 620. The dense performance data may be dense overlay data. The dense performance data may be provided at a hyperdense resolution, which may be higher than a resolution obtainable by a metrology tool for measuring performance data. The model 610 may further use reference data as input, wherein reference data may be historical data of the second substrate.

In some implementations, the first and second substrate may be a reference substrate. In one example, the reference substrate will typically be an overlay substrate but other substrates may be used, such as a levelling substrate as described above. The model may be run multiple times for a substrate, for example at predetermined time intervals, or when specifically implemented by a user, for example in response to a detected event. Performing the method multiple times, which may be periodically, may comprise repeating the steps of obtaining input data and running the model 610 to determine output performance data. The repeated use of the model 610 may comprise determining model 610 once, and using the same determined model 610 for the multiple runs of the model 610. Updating model 610 may be performed separately from running model 610.

The parameter of the lithographic apparatus may be a measure of the quality of a substrate support of the lithographic apparatus for the second substrate. Alternatively or additionally, the substrate support may be related to one or more settings of the lithographic apparatus. Specifically, the settings may be exposure settings for the lithographic apparatus. More specifically, the one or more settings may affect the overlay of the resulting exposed pattern.

The parameter may comprise a single value, or may comprise a plurality of values. The parameter may relate to a metrology map. A metrology map may be a plurality of values linking metrology values to a position on the substrate to provide information relevant to the calibration of the lithographic apparatus. For example, the metrology map may include indications as to where exposure focus and/or dose needs to be corrected. Hence, the method may further comprise updating one or more settings of the lithographic apparatus LA based on the metrology map. The one or more settings of the lithographic apparatus may relate to a positional grid of the lithographic apparatus LA.

In some implementations the parameter may relate to a pre-exposure condition of the lithographic apparatus LA. The method may further comprise determining, based on the determined parameter, whether one or more of the settings of the lithographic apparatus LA requires a correction. The method may further comprise estimating a level of required correction, that is to say, estimating quantitatively the amount by which one or more of the settings need to be amended based on the determined parameter of the lithographic apparatus LA. For example, the performance data may be overlay data of the second substrate. The parameter determined based on the overlay data may comprise one or more settings of the lithographic apparatus LA, and adjustments may be made to one or more of the settings to correct for mismatch in overlay indicated by the determine overlay data, to improve overlay performance in subsequent exposures.

The method as described above may comprise two models, wherein the models have different inputs and different outputs. Accordingly, the first model and the second model may have different sets of weights and/or biases. Specifically the method may comprise running a first model at a first periodicity, and running a second model at a second periodicity. The first periodicity may be higher than the second periodicity, that is to say, the first model may be run more frequently than the second model. The first model may use a calibration substrate as a second substrate, and the second model may use a reference model as a second substrate. The first model may receive as input height variation data and optionally alignment data. The first model may be run to determine a first output, wherein the output may be performance data, and preferably hyperdense performance data. The second model may receive as input data height variation data, alignment data, and sparse performance data. The second model may be run to determine a second output, wherein the second output may be performance data, and preferably hyperdense performance data.

In order to determine a parameter of a substrate, for example using the models and methods described above, it is beneficial to know properties of the substrate on which the parameter is determined. These properties may be used to interpret metrology data of the substrate to determine the parameter. This calibration of a substrate may involve the determination of a wafer error correction (WEC) file. A WEC file may express a deviation of a substrate from a particular, predetermined standard for the substrate. Data comprised within a WEC file may for example be provided to a method and/or model described above to determine performance data of a substrate.

A WEC file may be based on metrology data. The metrology data may be time consuming to obtain, taking up time of one or more metrology tools MT related to the lithographic apparatus LA and processes described herein. While a metrology tool MT is performing measurements for calibration of a substrate, it is not free to be used for other metrology applications. As a WEC file contains data relating to properties specific to each substrate, a different WEC file may be generated for each substrate. Considerable metrology and administrative effort may be required to obtain a WEC file for calibration of a substrate. It is therefore desirable to reduce the time and cost needed to calibrate a substrate. This may for example be done by reducing the amount of metrology data and/or to change the type of metrology data needed to determine the properties of the substrate.

Proposed herein are methods to calibrate a substrate using a model. The model may be used to determine an estimate of a parameter for calibrating a substrate, for example performance data of a substrate such as overlay. The parameter may be difficult to measure, making it desirable to estimate it based on other data, for example height variation data related to the substrate. The difficult to measure parameter may be inferred by the model from data that is less time consuming/costly to obtain. The data may be metrology data, for example height variation data such as levelling data. The cost and time required to obtain dense levelling data may be significantly lower than the cost and time of obtaining overlay data.

The model may be trained on metrology data. Specifically, height variation data and corresponding performance data (e.g. overlay data) may be provided. The height variation data and the performance data may be metrology data. The model may be trained to predict performance data based on the height variation data. The accuracy of the model may be tested and trained by comparing the prediction to the provided performance data. The height variation data and performance data provided for training the model may be dense height variation data and dense performance data. The height variation data may be levelling data. The performance data may be overlay data.

Once the model is trained, performance data may be inferred based on height variation data. In one example implementation, performance data is inferred from height variation data by the model without providing performance data. An advantage of this model is to remove the need for metrology of performance data for calibration of a substrate. The inferred performance data may be dense. In another example implementation, dense performance data may be inferred from dense height variation data and sparse performance data. This reduces the amount of performance data metrology required to calibrate a substrate. The performance data may be overlay data.

The model may be used to determine a contribution of a processing step to the properties of a substrate. For example, the model may be used to infer overlay data, which may be used for calibrating a substrate. Specifically, a substrate may be a reference substrate that has undergone an etching step. The model may determine the overlay resulting from the etching of the substrate. The overlay may be determined based on levelling data of the substrate that has been input to the model. Levelling data, or other forms of height variation data obtained for a substrate, may be deconvolved/decomposed into constituent parts as described above. Using such a decomposition, contributions of an etching step to the properties of a substrate may be extracted from height variation data. The contribution of an etching step may be described as a field signature, or a process signature.

Figure 7:
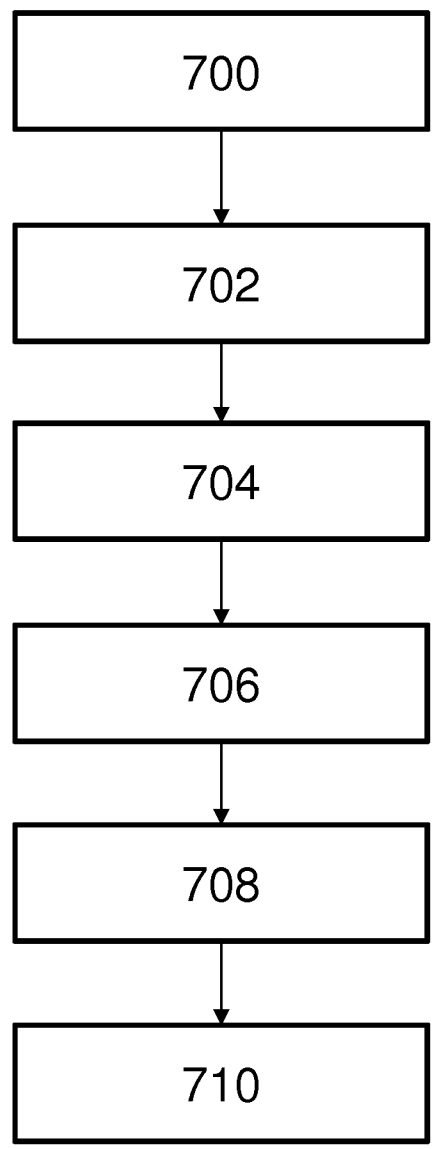
FIG. 7 depicts a schematic flow diagram of a method for calibrating a substrate.

FIG. 7 depicts a flow diagram with steps of a method for calibrating a substrate. First, a model trained to correlate height variation data to performance data is obtained 700. In 702, height variation data of the substrate to be calibrated is obtained. Height variation data may be measured as part of the method, or may be provided from a source that determined the height variation data separate from the method. In 704, a process signature may be determined. The determination may involve a decomposition of the height variation data into a plurality of subgroups, which will be explained in more detail in relation to FIG. 8. One of the subgroups may be a process signature. A process signature may be height variation data comprising information relating to one or more processing steps undergone by the substrate. For example, the processing signature may relate to an etch of the substrate. Data related to the process signature may be provided 706 as an input to the model. In some instances the data relating to the process signature may be the process signature itself. In other instances, the process signature may be processed further before providing as input to the model.

For example the data may comprise a substrate-to-substrate process signature, as described in more detail below. Once the input related to the process signature has been provided the model may be run 708, to determine a model output. The model output may comprise information related to performance data. Specifically, the output may comprise a predicted deviation of performance data between the substrate and a substrate standard. The substrate standard may be a predetermined standard set of properties/parameter values provided for the substrate. The predicted deviation may be used to calibrate 710 the substrate. For example, a predicted deviation of overlay data may correspond to a wafer error measured overlay data. A predicted overlay deviation may therefore be provided instead of or in addition to a wafer error correction file comprising overlay metrology data. The estimation of overlay data may reduce or remove the requirement for overlay metrology data. This may have an advantage of reducing the amount of time metrology tools MT are used for calibrating a substrate.

FIG. 8 depicts a schematic overview of a decomposition of height variation data into a plurality of subgroups. A disk shows height variation data across a substrate. Measured height variation data may be the sum of height variation graphs 750 and 752, wherein 752 shows a second order polynomial distribution across the substrate, representing the effects resulting from wafer stage deformation. The wafer stage deformation effects 752 are removed from measured height variation data to form height variation data 750, comprising height variation data resulting from effects of the substrate itself. Height variation data 750 may be decomposed 754 into a plurality of subgroups. Each subgroup may represent a signature of an effect on the substrate. For example, height variation data subgroup 756 comprises a primary signature of the substrate. Height variation data subgroup 758 comprises a radial signature, height variation data subgroup 760 comprises a secondary signature, height variation data subgroup 762 comprises a process signature, and height variation data subgroup 764 comprises a high, middle, and low frequency signature.

Contributions to height variation data having different causes may be extracted from the height variation data using a decomposition. As illustrated in FIG. 8, a contribution to height variation data by processing of a wafer can be extracted as subgroup 762 in FIG. 8, forming a process signature. The process signature of a reference substrate may for example represent contributions to properties of the substrate resulting from an etch of the substrate. The effects of etches may vary between different reference substrates produced to the same design. The differences between different substrates may represent deviations between substrates, and may be referred to as substrate-to-substrate or wafer-2-wafer (w2w) process signatures. In order to determine a deviation of a process signature of a substrate, the process signature may be compared to an average process signature taken from a plurality of substrates. Using the model described herein, the w2w process signature may be provided as model input to determine a deviation of performance data of the substrate from the predetermined substrate standard. This deviation of performance data may be seen as a w2w performance data signature.

A w2w process signature may be determined as a difference between two substrates. In some instances height variation from a plurality of substrates may be used to determine a w2w process signature. In order to be able to compare the substrates, the standard to which the substrate is designed is the same for the plurality of substrates. Specifically, a plurality of substrates to be compared may belong to the same lot of substrates. An advantage of comparing substrates belonging to the same lot of substrates is that they have undergone the same set of production steps, and may therefore be closely aligned properties. This may make them suitable to be compared and/or averaged.

Figure 9:
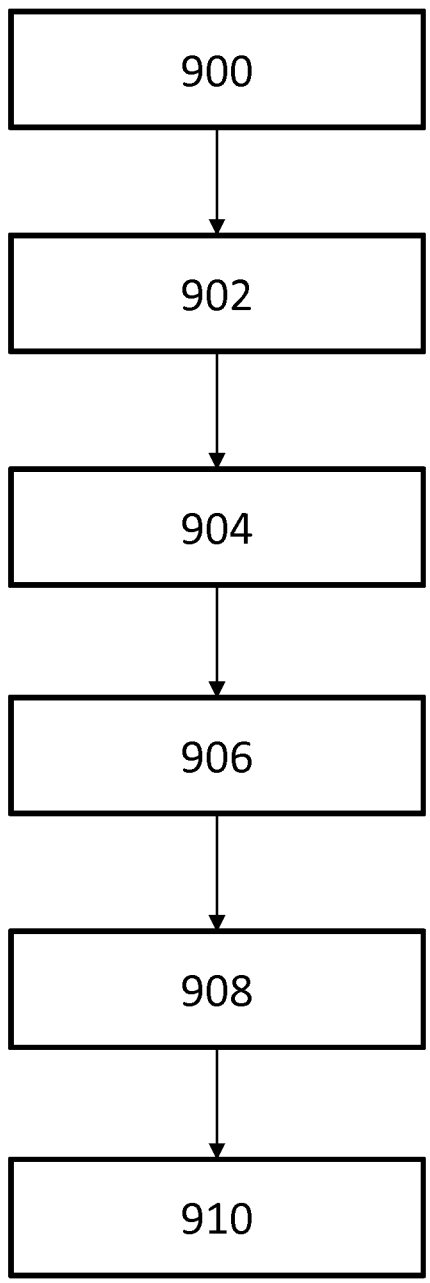
FIG. 9 depicts a schematic flow diagram of a method of determining a data related to a process signature for providing to a model for calibrating a substrate.

In order to compare process signatures of a plurality of substrates an average process signature may be determined, and a process signature of a substrate may then be compared to that average. An advantage of determining an average, is the reduction of the effect of errors or deviations of properties present on any single substrate. FIG. 9 depicts a flow diagram of steps in an exemplary method of determining data related to a process signature for providing to a model. In 900, a plurality of substrates is provided. The plurality of substrates may all have the same design. The plurality of substrates may belong to the same lot. In step 902, height variation data is provided for each of the plurality of substrates. In step 904, a process signature is determined from the height variation data from each of the plurality of substrates. The determination of a process signature of a substrate may be based on height variation data of that substrate without taking into account height variation or other data relating to other substrates. An average of the plurality of individually determined process signatures is determined 906. The average is subtracted 908 from the process signature of a substrate in order to determine a w2w process signature of that substrate. The w2w process signature is provided as input to the model to determine performance data. A w2w process signature may represent a deviation of a process signature compared to the other substrates. It may be determined for each of the plurality of substrates from which the average is determined.

Figure 10:
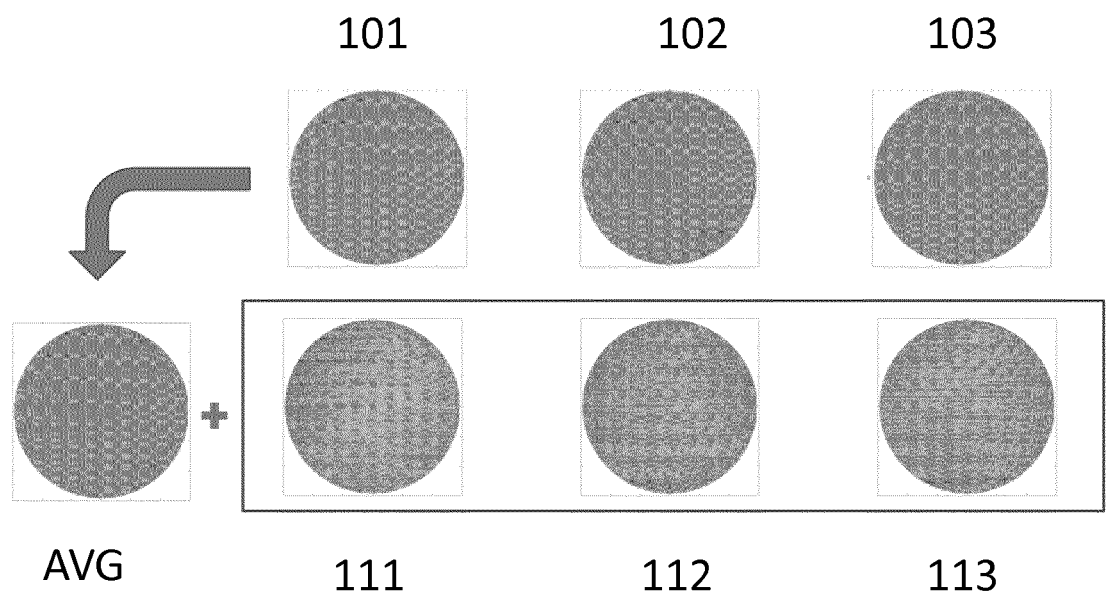
FIG. 10 depicts a schematic overview of a determination of a w2w process signature for a substrate.

FIG. 10 depicts a schematic overview of the determination of w2w process signatures. The process signatures of three substrates are provided as 101, 102 and 103. An average process signature AVG is determined based on the substrates 101, 102, 103. For each of the substrates the average process signature AVG is then subtracted from the process signature 101, 102, 103. The resulting height variation data are the w2w process signatures for the three substrates: 111, 112, 113.

Further embodiments of the invention are disclosed in the list of numbered clauses below:

1. A method of determining a parameter of a lithographic apparatus, the method comprising:
   providing first height variation data of a first substrate;
   providing first performance data of the first substrate;
   determining a model based on the first height variation data and the first performance data;
   obtaining second height variation data of a second substrate;
   inputting the second height variation data to the model;
   determining, by running the model, second performance data of the second substrate; and
   determining a parameter of the apparatus based on the second performance data.
2. A method according to clause 1 wherein the first substrate and the second substrate are the same substrate.
3. The method according to clause 1, further comprising decomposing the first height variation data into at least a substrate specific fingerprint and wherein the determining of the model is based on the substrate specific fingerprint.
4. The method according to any of the preceding clauses, wherein the performance data is overlay data.

5. The method according to any of the preceding clauses wherein the height variation data is levelling data.
6. A method according to any of the preceding clauses, further comprising: obtaining reference data of the second substrate; and inputting the reference data to the model.
7. The method according to clause 6, wherein obtaining the reference data comprises running the model a first time, the method further comprising: storing the second performance data as the reference data for inputting during a subsequent run of the model.
8. The method according to any of the preceding clauses, wherein the parameter is monitored to schedule maintenance action of the apparatus.
9. The method according to clause 8, wherein the scheduled maintenance action relates to a substrate support or a reference substrate used to calibrate substrate positioning in the lithographic apparatus.
10. The method according to any of the preceding clauses, further comprising:
providing first alignment data of the first substrate;
determining the model based on the first alignment data;
obtaining second alignment data of the second substrate; and
inputting the second alignment data to the model.
11. The method according to clause 10, further comprising upsampling the resolution of the first or second alignment data, based on the respective first or second height variation data
12. The method according to any of the preceding clauses, further comprising:
decomposing the second height variation data into a plurality of subgroups, and inputting at least one of the plurality of subgroups to the model.
13. The method according to clause 12, wherein one of the subgroups comprises data related to a field signature of the second substrate, and removing the field signature subgroup from at least one of the plurality of subgroups prior to inputting to the model.
14. The method according to any of the preceding clauses, further comprising:
obtaining second performance data of the second substrate at a sparse resolution;
inputting the sparse second performance data to the model; and
estimating, using the model with input data, dense second performance data.
15. The method according to clause 14, further comprising obtaining the sparse second performance data from the second substrate using a metrology apparatus.
16. The method according to any of the preceding clauses wherein the second substrate is a reference substrate.
17. The method according to any of clauses 1 to 13 wherein the second substrate is a calibration substrate.
18. The method according to any of the preceding clauses, wherein the parameter is a measure of the quality of a substrate support of the apparatus supporting the second substrate.
19. The method according to any of clauses 16 to 18, wherein the lithographic apparatus comprises the reference substrate.
20. The method according to any of the preceding clauses, wherein the parameter is related to one or more settings of the lithographic apparatus.
21. The method according to any of the preceding clauses, wherein the one or more settings of the lithographic apparatus is an exposure setting.
22. The method according to any of the preceding clauses, wherein determining the model comprises determining a matrix of weights and biases.
23. The method according to any of the preceding clauses, wherein determining the model comprises using a machine learning algorithm.
24. The method according to any of the preceding clauses, wherein the model comprises a neural network.
25. The method according to any of the preceding clause, wherein the parameter relates to a metrology map.
26. The method according to clause 25, further comprising: updating one or more settings of the lithographic apparatus on the basis of the metrology map.
27. The method according to clause 26, wherein the one or more settings relate to a positional grid of the lithographic apparatus.
28. The method according to any preceding clause, wherein the parameter relates to a pre-exposure condition of the lithographic apparatus, the method further comprising: determining whether one or more settings of the lithographic apparatus requires correcting.
29. The method according to clause 28, further comprising: estimating a level of required correction.
30. The method according to any of the preceding clauses, wherein the model comprises a first model and a second model, wherein the first and second models have different inputs and different outputs.
31. The method according to clause 30, wherein the first model is run at a first periodicity to determine a first output relating to a first parameter; and,
the second model is run at a second periodicity to determine a second output relating to a second parameter, wherein the first periodicity is greater than the second periodicity.
32. The method according to clause 31, wherein running the first model comprises using a calibration substrate as the second substrate, and using the second model comprises using a reference substrate as the second substrate.
33. A method of improving an exposure by a lithographic apparatus, the method comprising:
loading a substrate into a machine onto a substrate support;
determining height variation data of the substrate prior to an exposure;
determining a parameter of the lithographic apparatus according to the method of clauses 1-32;
updating the lithographic apparatus based on the parameter; and exposing a pattern on the substrate by the lithographic apparatus.
34. A lithographic apparatus comprising:
a processor configured to determine a parameter in accordance with method clauses 1 to 33.
35. A computer program comprising instructions which, when executed on at least one processor, cause the at least one processor to control an apparatus to carry out the method according to any of clauses 1 to 33.
36. A carrier containing the computer program of clause 35, wherein the carrier is one of an electronic signal, optical signal, radio signal, or non-transitory computer readable storage medium.
37. A recipe for controlling a lithographic apparatus comprising setpoints of a control parameter associated with the parameter as determined according to the method of any of clause 1 to 33.

38. The recipe for controlling the lithographic apparatus according to clause 37, wherein the control parameter is associated with control of an overlay error.
39. The recipe for controlling the lithographic apparatus according to clause 38, wherein the setpoints are provided as coefficients of a high order model describing positioning errors across a substrate.
40. The recipe according to clause 37 to 39, wherein the recipe is configured to periodically calibrate the lithographic apparatus.
41. The recipe according to clause 40, wherein the calibration is configured to calibrate a coordinate system of a substrate positioning and/or substrate measuring system within the lithographic apparatus.
42. A method for calibrating a substrate, the method comprising:
obtaining a model trained to correlate height variation data to performance parameter data;
obtaining a height variation data of the substrate;
decomposing the height variation data to determine a process signature of the substrate;
inputting data related to the process signature to the model;
running the model to determine a predicted deviation of performance data between the substrate and a substrate standard; and
calibrating the substrate using the predicted deviation of the performance parameter.
43. A method according to clause 42 wherein the height variation data is levelling data.
44. A method according to any of clauses 42 to 43, wherein the performance data is overlay data.
45. A method according to any of clauses 42 to 44, wherein the data related to the process signature comprises the process signature.
46. A method according to any of clauses 42 to 45, further comprising:
determining, for a plurality of substrates, an average process signature; and
subtracting, the average process signature from the process signature of the substrate to determine a substrate-to-substrate process signature;
wherein the data related to the process signature comprises the substrate-to-substrate process signature.
47. A method according to any of clauses 42 to 46, wherein the process signature relates to an etch of the substrate.
48. A method according to any of clauses 42 to 47, wherein the substrate is reference substrate.

Described herein are methods of improving an exposure by a lithographic apparatus LA, wherein the methods comprise loading a substrate into a machine prior to an exposure by the lithographic apparatus LA, wherein the machine may be a height variation metrology tool, for example a level sensor. The height variation metrology tool may be integrated into the lithographic apparatus, in which case the machine may refer to the lithographic apparatus LA with integrated height variation metrology tool. The method further comprises determining a parameter of the lithographic apparatus according to the methods described above. The method further comprises updating the lithographic apparatus LA based on the parameter, and exposing a pattern on the substrate by the updated lithographic apparatus LA. Updating the lithographic apparatus LA may comprise updating one or more settings of the lithographic apparatus LA as described above.

The method described herein may be used to define one or more recipes for controlling a lithographic apparatus LA. The recipe may comprise a plurality of setpoints of a control parameter associated with the parameter determined according to the methods described above. The control parameter may be associated with control of an overlay error of an exposure by the lithographic apparatus LA. The plurality of setpoints may be provided as coefficients of a high order model describing positioning errors across a substrate. The recipe may be used to calibrate the lithographic apparatus LA. The calibration based on the recipe may be performed periodically. Calibration of the lithographic apparatus LA may comprise calibration of one or both of a coordinate system of a substrate positioning system and a substrate measuring system within the lithographic apparatus.

The lithographic apparatus LA comprises a processor, and may comprise a plurality of processors. The processor may be connected to a carrier, which may be comprised within lithographic apparatus LA or computer system CL connected to lithographic apparatus LA. The carrier may be one of an electronic signal, optical signal, radio signal, or non-transitory computer readable storage medium, for example a memory. The carrier comprises instructions which, when executed on a processor, cause the processor to control an apparatus to carry out any of the methods as described above. The apparatus may be one or both of the computer system CL and lithographic apparatus LA.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. A method comprising:
decomposing first height variation data of a first substrate, into at least a substrate specific fingerprint;
determining a model based at least partially on the first height variation data, first performance data of the first substrate and the substrate specific fingerprint;

obtaining second height variation data of a second substrate;

inputting the second height variation data to the model;

determining, by running the model using a hardware computer system, second performance data of the second substrate; and determining a parameter of a lithographic apparatus based on the second performance data.

2. The method according to claim 1, wherein the first substrate and the second substrate are the same substrate.

3. The method according to claim 1, wherein the first and second performance data is overlay data and the first and second height variation data is levelling data.

4. The method according to claim 1, further comprising:
obtaining reference data of the second substrate; and
inputting the reference data to the model.

5. The method according to claim 4, wherein obtaining the reference data comprises running the model a first time, and further comprising storing the second performance data as the reference data for inputting during a subsequent run of the model.

6. The method according to claim 1, further comprising:
determining the model based additionally on first alignment data of the first substrate;
obtaining second alignment data of the second substrate; and
inputting the second alignment data to the model.

7. The method according to claim 6, further comprising upsampling the resolution of the first or second alignment data, based on the respective first or second height variation data.

8. The method according to claim 1, further comprising:
decomposing the second height variation data into a plurality of subgroups, and inputting at least one subgroup of the plurality of subgroups to the model.

9. The method according to claim 1, further comprising:
obtaining second performance data of the second substrate at a sparse resolution;
inputting the sparse second performance data to the model; and
estimating, using the model with input data, dense second performance data.

10. The method according to claim 1, wherein the second substrate is a reference substrate or calibration substrate.

11. The method according to claim 1, wherein the parameter is a measure of the quality of a substrate support of the lithographic apparatus supporting the second substrate.

12. The method according to claim 1, wherein determining the model comprises determining a matrix of weights and biases.

13. The method according to claim 1, wherein the model comprises a first model and a second model, wherein the first and second models have different inputs and different outputs.

14. The method according to claim 13, wherein the first model is run at a first periodicity to determine a first output relating to a first parameter; and
the second model is run at a second periodicity to determine a second output relating to a second parameter,
wherein the first periodicity is greater than the second periodicity.

15. The method according to claim 14, wherein running the first model comprises using a calibration substrate as the second substrate, and running the second model comprises using a reference substrate as the second substrate.

16. A method comprising:
obtaining a model trained to correlate height variation data to data of a performance parameter;
obtaining a set of height variation data of a substrate;
decomposing the set of height variation data to determine a process signature of the substrate;
inputting data related to the process signature to the model;
running the model, using a hardware computer system, to determine a predicted deviation of a value of the performance parameter between the substrate and a substrate standard; and
calibrating the substrate using the predicted deviation.

17. The method according to claim 16, wherein the height variation data is levelling data.

18. The method according to claim 16, wherein the data of the performance parameter is overlay data.

19. The method according to claim 16, wherein the data related to the process signature comprises the process signature.

20. The method according to claim 16, wherein the substrate is a reference substrate.

* * * * *